(12) United States Patent
Wu et al.

(10) Patent No.: US 9,490,142 B2
(45) Date of Patent: Nov. 8, 2016

(54) CU-LOW K CLEANING AND PROTECTION COMPOSITIONS

(71) Applicants: Jiali Wu, Yorktown Heights, NY (US); Kellsie Shan, Yorktown Heights, NY (US)

(72) Inventors: Jiali Wu, Yorktown Heights, NY (US); Kellsie Shan, Yorktown Heights, NY (US)

(73) Assignee: Qualsig Inc., Carmel, NY (US)

( * ) Notice: Subject to any disclaimer, the term of this patent is extended or adjusted under 35 U.S.C. 154(b) by 0 days.

(21) Appl. No.: 14/628,277

(22) Filed: Apr. 9, 2015

(65) Prior Publication Data
US 2016/0300730 A1    Oct. 13, 2016

(51) Int. Cl.
| | | |
|---|---|---|
| *B08B 3/04* | (2006.01) | |
| *H01L 21/321* | (2006.01) | |
| *H01L 21/02* | (2006.01) | |
| *H01L 21/768* | (2006.01) | |
| *H01L 23/532* | (2006.01) | |
| *C09G 1/04* | (2006.01) | |
| *B08B 1/00* | (2006.01) | |
| *B08B 3/00* | (2006.01) | |

(52) U.S. Cl.
CPC ............ *H01L 21/3212* (2013.01); *C09G 1/04* (2013.01); *H01L 21/02074* (2013.01); *H01L 21/7684* (2013.01); *H01L 23/53228* (2013.01); *B08B 1/00* (2013.01); *B08B 1/002* (2013.01); *B08B 3/00* (2013.01); *B08B 3/04* (2013.01)

(58) Field of Classification Search
CPC ............ H01L 21/3212; H01L 21/02074; H01L 21/7684; H01L 23/53228; C09G 1/04; B08B 1/00; B08B 1/002; B08B 3/00; B08B 3/04
See application file for complete search history.

(56) References Cited

U.S. PATENT DOCUMENTS

| | | | | |
|---|---|---|---|---|
| 2004/0048761 A1* | 3/2004 | Ikemoto | ............... | C11D 3/3723 510/175 |
| 2004/0186206 A1* | 9/2004 | Yoneda | .................... | C08K 3/36 524/95 |
| 2008/0139436 A1* | 6/2008 | Reid | ...................... | C11D 3/044 510/176 |
| 2009/0281017 A1* | 11/2009 | Suzuki | .................... | G03F 7/425 510/176 |
| 2012/0129345 A1* | 5/2012 | Lee | ......................... | C11D 1/22 438/692 |
| 2014/0076365 A1* | 3/2014 | Otake | ............... | H01L 21/02074 134/29 |
| 2014/0264151 A1* | 9/2014 | Ko | .................... | H01L 21/02074 252/79.1 |
| 2016/0075971 A1* | 3/2016 | Liu | ......................... | C23G 1/18 510/175 |

* cited by examiner

*Primary Examiner* — Bibi Carrillo

(57) ABSTRACT

This disclosure relates post chemical mechanical planarization cleaning composition of semiconductor substrate for advanced electronics fabrication and packaging. It provides novel corrosion inhibition and quality upmost Cu-low K surfaces to the demanding reliability of nano device and Cu interconnection. Its efficacious cleaning without changing of ultra-low K dielectric and interfering with ultimate electronics performance also offers a cleaning solution to the Cu-low K structure of post reactive ion etching as well as resist ashing in semiconductor fabrication process flow.

2 Claims, 5 Drawing Sheets

CU-LOW K CLEANING AND PROTECTION COMPOSITIONS

BACKGROUND

The present disclosure relates to a chemical composition for semiconductor cleaning processes, and more particularly, for a post chemical mechanical planarization (CMP) cleaning, which can be used in advanced semiconductor fabrication and packaging.

Post CMP cleaning is perhaps one of the most critical steps in reliability improvement for semiconductor fabrication and packaging. For semiconductor substrate with copper interconnects architecture, Cu corrosion and surface residuals associated with post chemical-mechanical planarization cleaning are quite often the major reliability detractor to such an extent that its cleanness improvement becomes the most pivotal step in the successful qualification and implementation of the technology.

With the ever shrinking ground rule, new challenges emerge and new types of post-CMP cleaning related corrosion and residuals are observed in advanced technology nodes such as 22 nm and beyond. Ultra-low K dielectric with even higher porosity is adopted as interline dielectric materials. However, such type dielectrics become more affinitive to the post-CMP cleaning residue which leads to dielectric constant increase. Meanwhile, to meet demanding scale own feature size as well as electric performance, Cu barrier switches from traditional TaN/Ta to TiN, Ru, RuN, RuTa, RuTaN, W, WN, Co, TaRu, CuMn, CuAl, or CuFO, etc. Their electrochemistry associated potential corrosion needs to be taken care of along with Cu corrosion inhibition. Furthermore, in fine pitch Cu interconnects, the electric potential becomes greater while the diffusion path becomes shorter, creating an environment that will expedite the formation of corrosion-related defects such as hollow metal and dendrites. As a result, interline dielectric constant instability, Cu and Cu barrier corrosion becomes increasing critical in that such defects are generated during cleaning and the queue time which ultimately leads to reliability failure in the cause of time delayed dielectric breakdown (TDDB) and/or electric migration (EM) tests.

Since CMP is the final and enabling process before one level of Cu interconnect is fully defined, not only can it generate residuals during the process per se (e. g. polish residues), but it will also reveal defects generated from prior processing steps, such as post-RIE cleaning, Cu barrier deposition, and Cu plating. Therefore, not only must the post Cu CMP cleaning process clean up the residuals generated by CMP, but it must also render sufficient compatibility with prior processes to prevent exacerbating pre-existing defects incoming to CMP.

In general, CMP slurries frequently include one or more corrosion inhibitors which selectively form a temporary protective coating on the copper interconnect surface. However, if an organic coating should remain on the copper interconnect surface after the cleaning process, the presence of such a coating can interfere with subsequent steps, e.g., chemical vapor deposition (CVD), and with the ultimate performance of the copper interconnect. In post CMP cleaning processes, therefore, it is an imperative to minimize organic(s) remaining or no-detectable coating on the copper surfaces, but with sufficient protection to copper (including Cu barrier) interconnect.

Furthermore, corrosion inhibitors in post-CMP composition have the tendency of breakdown or oxidized while exposed to the air or oxygen saturated solution. Antioxidant or reduction agent often included in post-CMP solution to eliminate or reduce the level of oxidant. At the same time to minimize Cu oxidation introduced Cu loss and line surface roughness.

Accordingly, there remains a critical need for a unique post-CMP cleaning composition capable of providing synergistic functions as of residual removal, post-CMP temporary organic coating minimization, as well as Cu (including Cu barrier) corrosion inhibition without compromising performances of nano devices.

In the present disclosure, a cleaning composition, which is applied to the post chemical-mechanical planarization process of a semiconductor substrate containing a damascene metal structure, is provided. A cleaning composition may contain various chemicals that perform different functions during the cleaning process. A cleaning composition must contain a cleaning agent that removes polish residuals, such as CMP slurry particles, polish pad debris, polished metals and low-K dielectrics, from the surface of semiconductor substrate with damascene Cu interconnects. A cleaning composition may contain chelating agent, a combination of chelating agents, corrosion-inhibitor, and/or antioxidant. The cleaning agent of the current disclosure efficiently clean the surface of the planarized substrate by removing CMP slurry particles, cleaning residual metal and dielectrics, as well as minimizing temporary organic protective coating from surfaces of semiconductor substrate. A chelating agent or combined chelating agents form multi chemical bonds with transition metal ions to prevent re-deposition. Corrosion inhibitor together with antioxidant function by either deposit a few molecular thick layer of film on upmost metal surface or reduce oxygen to prevent oxidation or electrochemical reaction without adversely affecting the physical properties of contact interfaces of back-end-of-line buildups. To prevent foreign materials redeposit back onto low-k (or ultra low-k) dielectric surfaces, inhibitor and/or antioxidant also function as a wetting agent to lower the surface tension of dielectrics.

DETAILED DESCRIPTION OF THE INVENTION

The present disclosure, which provides a post chemical-mechanical planarization cleaning composition for advanced interconnect technology, will now be described in detail with introduction of Cu interconnect containing wafer substrate formation by referring to the following discussion and drawings that render a background to the present disclosure. It is noted that the drawings of the present application are provided for illustrative purposes only and, as such, the drawings are not drawn to scale. In the following description, some specific details are set forth, such as particular structures, components, materials, dimensions, and processing steps, in order to provide a thorough understanding and application background of the present disclosure.

Reference is first made to FIGS. 1-4 which illustrates an embodiment in which a planarized interconnect structure is first formed, and then subjected to the post metal CMP cleaning process with present disclosure of cleaning composition. Although the description and drawings illustrate using the composition of the present disclosure on a planarized interconnect structure, the post-CMP cleaning composition can be used in other structures in which a metal interconnect embedded layer is subjected to chemical-mechanical planarization.

Figure 1:
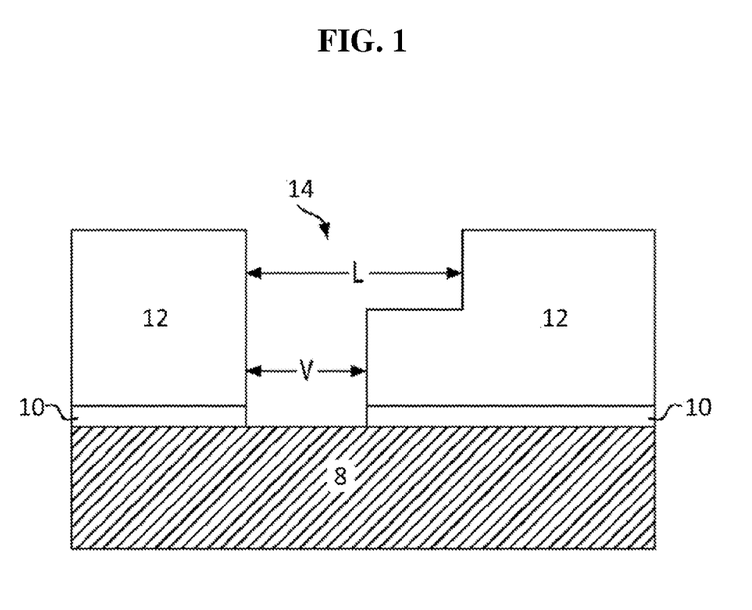
FIG. 1 is a cross section representation illustrating a structure including an interconnect dielectric material having at least one opening present therein and located atop a semiconductor substrate that can be employed in one embodiment of the present disclosure.

Referring first to FIG. 1, there is an illustrated structure including an interconnect dielectric material 12 having at least one opening 14 present therein and located atop a semiconductor wafer, i.e., substrate, 8 that can be employed in cleaning process with cleaning composition of the present disclosure.

Examples of semiconductor materials that may be used as the semiconductor include, but are not limited to, Si, SiGe, SiGeC, SiC, Ge alloys GaAs, InAs, InP, $SiO_2$, quartz, and alumina, zirconia, sapphire, magnesia, aluminum nitride, tungsten carbide, silicon nitride, and silicon carbide, and other II/V or II/VI compound substrates. In one embodiment, the semiconductor substrate 8 may comprise a bulk semiconductor substrate. In another embodiment, the semiconductor wafer 8 may comprise multilayers of semiconductor materials. In yet a further embodiment of the present disclosure, the semiconductor substrate 8 may comprise a semiconductor-on-insulator substrate such as, for example, a silicon-on-insulator semiconductor (SOI) substrate or a silicon germanium-on-insulator substrate.

A blanket layer of interconnect dielectric material is then formed atop the semiconductor substrate 8. In some embodiments, an etch stop layer 10 can be formed between the semiconductor wafer 8 and the blanket layer of interconnect dielectric material. When present, the etch stop layer 10 may comprise a dielectric material such as, for example, SiC, $Si_4N_3$, $SiO_2$, a carbon doped oxide, a nitrogen and hydrogen doped silicon carbide SiC(N,H), silicon nitride, silicon oxynitride and multilayers thereof. The etch stop layer 10 can be formed by a deposition process including, for example, chemical vapor deposition (CVD), plasma enhanced chemical deposition (PECVD), chemical deposition, evaporation and coating. When present, the thickness of the etch stop layer 10 is from 10 nm to 75 nm. Other thicknesses that are greater than or lesser than the thickness range mentioned above can also be used for the etch stop layer 10.

The blanket layer of interconnect dielectric material may comprise any interlevel or intralevel dielectric including inorganic dielectrics or organic dielectrics. The blanket layer of interconnect dielectric material may be porous or nonporous. Some examples of suitable dielectrics that can be used as the blanket layer of interconnect dielectric material include, but are not limited to, $SiO_2$, silsesquixoanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds.

The blanket layer of interconnect dielectric material typically has a dielectric constant that is about 4.0 or less, with a dielectric constant of about 2.8 or less being even more typical. These dielectrics generally have a lower parasitic crosstalk as compared with dielectric materials that have a higher dielectric constant than 4.0. The thickness of the blanket layer of interconnect dielectric material may vary depending upon the dielectric material used as well as the exact number of dielectrics within blanket layer of interconnect dielectric material. Typically, and for normal interconnect structures, the blanket layer of interconnect dielectric material has a thickness from about 200 to about 1000 nm. The blanket layer of interconnect dielectric material may be formed utilizing a deposition process including, for example, CVD, PECVD, chemical solution deposition, evaporation and spin-on coating.

The blanket layer of interconnect dielectric material is then subjected to a single or damascene process to form interconnect dielectric material 16 having at least one opening 14 therein. A single damascene process includes lithography and etching, while a dual damascene includes an iteration of lithography and etching. Lithographic includes forming a blanket layer of photoresist material (not shown) atop the blanket layer of interconnect dielectric material, exposing the photoresist material to a desired pattern of radiation, and then developing the exposed resist. Etching may include a dry etch such as, for example, reaction ion etching (RIE), ion beam etching, plasma etching and laser ablation. During one of the etch processes used to pattern the interconnect dielectric material, or in a separate etch there from, at least one portion of the etch stop layer 10 that is located at a lower segment of the at least one opening 14 and beneath the now patterned interconnect dielectric material 12 can be opened, as shown in FIG. 1. The at least one opening 14 can be a via opening, a line (i.e., trench) opening, or a combined via (V) and line (L) opening as shown in FIG. 1.

Figure 2:
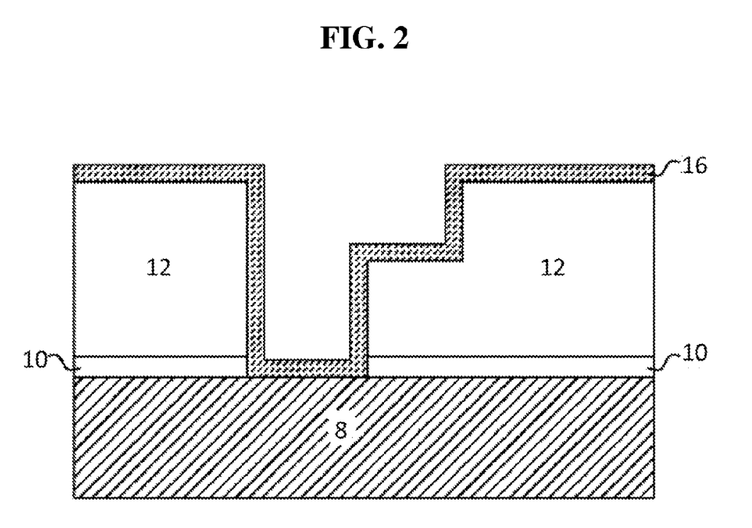
FIG. 2 is a cross section representation illustrating the structure of FIG. 1 after forming a contiguous diffusion barrier liner material on exposed surfaces thereof.

Referring now to FIG. 2, there is illustrated the structure of FIG. 1 after forming a contiguous diffusion barrier liner material 16 on exposed surfaces of the structure including the uppermost surface of the interconnect dielectric material 12 and the sidewall surface of the interconnect dielectric material 12 within each opening 18. The contiguous diffusion barrier liner material 16 may comprise Ta, TaN, Ti, TiN, Ru, RuN, RuTa, RuTaN, W, WN Co, TaRu, CuMn, CuAl, or CuFO, or any other material that can serve as a barrier to prevent conductive metal atoms from diffusing there through. Combinations of these materials can also be used forming a multilayered stacked diffusion barrier liner material. The contiguous diffusion barrier liner material 16 can be formed utilizing a deposition process such as, for example, atomic layer deposition (ALD), CVD, PECVD, physical vapor deposition (PVD), and sputtering. The thickness of the contiguous diffusion barrier liner material 16 may be from 5 nm to 50 nm. Other thicknesses that are greater than or lesser than the thickness range mentioned above can also be used for the contiguous diffusion barrier liner material 16.

Figure 3:
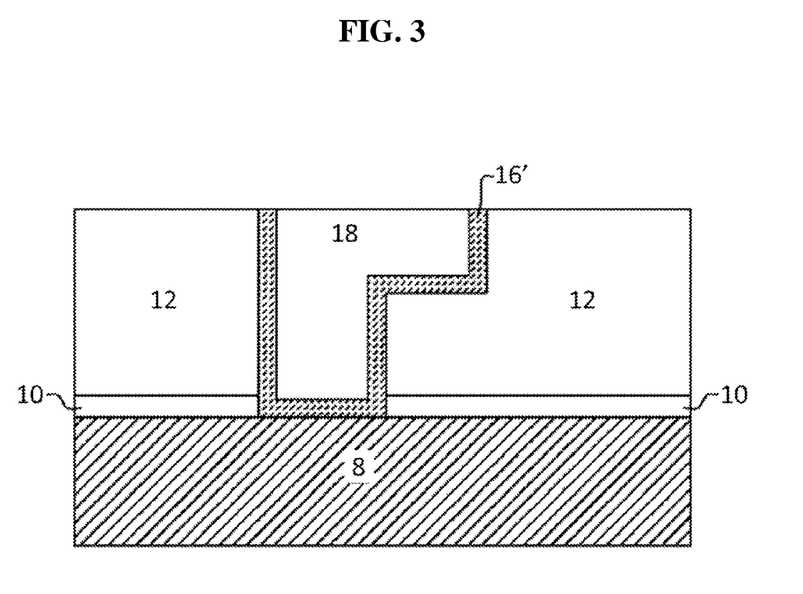
FIG. 3 is a cross section representation illustrating the structure of FIG. 2 after depositing a conductive metal-containing material and performing chemical-mechanical planarization.

Referring to FIG. 3, there is illustrated the structure of FIG. 2 after depositing a conductive metal-containing material and performing chemical-mechanical planarization. In the drawing, element 18 refers to a metal structure that comprises a remaining portion of the conductive metal-containing material after planarization, while element 16' denotes a remaining portion of the contiguous diffusion barrier liner material 16 after planarization. The remaining portion of the contiguous diffusion barrier material 16' is continuously present in the at least one opening 14. Moreover and following planarization, the uppermost surfaces of the metal structure 18 and the remaining portion of the contiguous diffusion barrier material 16' are coplanar with an uppermost surface of the interconnect dielectric material 12.

The conductive metal-containing material used in forming the metal structure 18 includes a conductive metal, an alloy comprising at least two conductive metals, a conductive metal silicide or combinations thereof. In one embodiment of the present disclosure, the conductive metal-containing material used in forming the metal structure 18 comprises Cu, W and/or Al. In yet another embodiment of the present disclosure the conductive metal-containing material used in forming the metal structure 18 comprises Cu or a Cu alloy such as, for example, AlCu. The conductive metal-containing material is filled into the remaining portions of the at least one opening 18 in the interconnect dielectric material 16 utilizing a deposition process including, but not limited to, CVD, PECVD, sputtering, chemical solution deposition and plating. When plating is used, a plating seed layer can be formed prior to plating.

After deposition, a portion of the conductive metal-containing material extends outside of the at least one opening 14 onto portions of the contiguous diffusion barrier liner material 16 that are located on the uppermost surface of interconnect dielectric material 12. This 'excess' portion of the conductive metal-containing material that extends outside of the at least one opening 14 and the portions of the contiguous diffusion barrier liner material 16 that are located on the uppermost surface of interconnect dielectric material 12 are then removed by chemical-mechanical planarization (CMP).

CMP is performed in any conventional polishing tool and a wide variety of conditions, i.e., polishing pressure, speeds, and polishing pads, as known to those skilled in the art can be employed. Also, various polishing slurries such as, for example, an alumina-based slurry and/or a silica-based slurry can be used. The CMP process can be conducted in two steps or three steps. In either embodiment, the final step of the CMP process removes at least the portions of the contiguous diffusion barrier liner material 16 that are located on uppermost surface of interconnect dielectric material 12.

Figure 4:
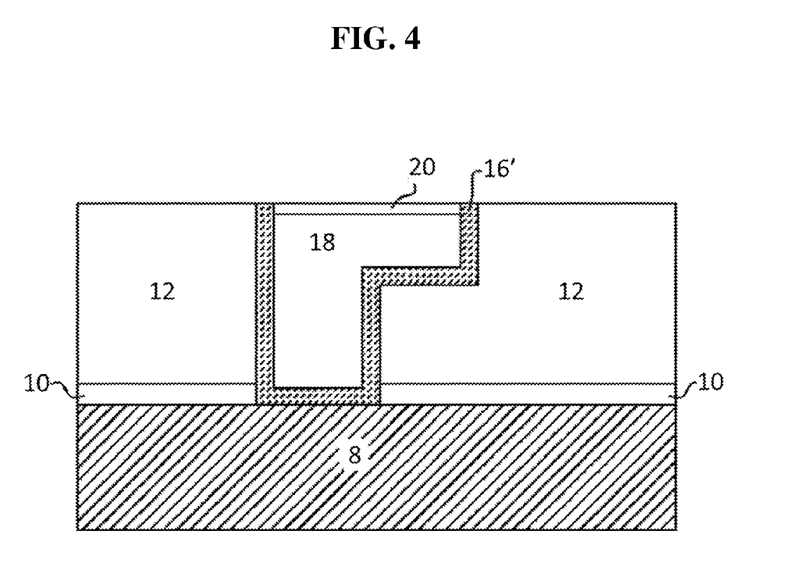
FIG. 4 is a cross section representation illustrating the structure of FIG. 3 after performing the post metal CMP cleaning process using present disclosure composition.

Referring now to FIG. 4, there is illustrated the structure of FIG. 3 after performing the post metal CMP cleaning process with the composition of present disclosure. The post metal CMP cleaning process typically includes two steps of post CMP cleaning processes with the present disclosure composition. The first step may include two or more rounds of brush cleaning. During first around of clean cycle, a planarized semiconductor substrate containing at least one metal structure (one example being the structure shown in FIG. 3) is subjected to a brush clean with the present disclosure composition spraying towards the wafer surface through a nozzle. Approximately 2 liters of cleaning composition is consumed along with brushing to remove relative large particles and residuals from substrate surface. The second round of cleaning process basically repeats the same process as round one but more for fine particles and residuals removal. Both brush clean is performed in a roller brush station which includes at least one roller brush. The roller brush used in the brush clean step usually is comprised of a plastic. During the brush clean in the present disclosure composition, particles and residues are removed from the planarized surface of a semiconductor substrate containing at least one metal structure. The removal occurs by dissolving and brushing. However, cleaning process doesn't limited to brush cleaning. The second step is dipping cleaning. Post-CMP semiconductor substrate is immersed in a cleaning tank and exposed to present disclosure composition while continuously spinning. Dipping step is for finer residue and water mark removal from semiconductor substrate.

The term "post-CMP particles and residues" is used herein to mean and include all of the types of undesirable materials that are typically generated from polishing slurry, copper oxides, barrier metals, interline dielectrics, chemical reaction by-products from etching and ashing processes, and degraded foreign materials from brush, etc. They must be taken into account in designing the cleaning composition.

The present disclosure composition employed for the post CMP cleaning process provide efficacious cleaning to remove particles and residues from substrate surface consist of metal, dielectric and temporary no-detectable protective coating (FIG. 4, 20) during the cleaning process. The term "No-detectable coating" used herein to mean that the protective coating is insignificant to the extent that it is no long capable of being detected by measurement as of electrochemical impedance spectroscopy. No-detectable coating may have similar chemical constituents as of corrosion inhibitors in CMP slurry and/or present disclosure composition.

The present disclosure composition is particularly useful for removing residues, e.g., post-CMP residues or residues from a microelectronic device structure formed post-etching or post-ashing without damaging the interconnect metals (e.g., copper), barrier layers(e.g., TaN, Co, RuTaN, etc.), and low-k dielectric materials.

The present disclosure composition is also particularly useful for removing residues, e.g., post-CMP, post-ashing or post etching particles and residues from Si interposer, quartz interposer, ceramic interposer, polymer interposer, as well as any dielectric buildup interposer on various substrates without damaging the interconnect metals (e.g., copper, aluminum, gold, etc.), barrier layers (e.g., passivated $SiO_2$), dielectric, and low-k dielectric materials.

A present disclosure composition used for post-CMP cleaning of a copper interconnect containing semiconductor substrate comprises at least:

(A) An alkaline aqueous solution in nature with a pH value in the range of 8.5-13.5. CMP slurry particles is stabilized in alkaline solution due to surface charge which results in repulsion from the water surface. An organic base and balance water are used for pH adjustment. The organic bases include, but not limited to, quaternary amine, including tetrahexylammonium hydroxide (THAH), tetramethylammonium hydroxide (TMAH), tetrapropylammonium hydroxide (TPAH), tetrabutylammonium hydroxide (TBAH), tetraethylammonium hydroxide (TEAH), trimethylphenylammonium hydroxide (TMPAH), tris(2-hydroxyethyl)methylammonium hydroxide (THEMAH), hexadecyltrimethylammonium hydroxide, benzyltriethylammonium hydroxide (BTEAH), benzyltrimethylammonium hydroxide (BTMAH), benzylbis(2-hydroxyethyl)methylammonium hydroxide, tributylmethylammonium hydroxide (TBMAH), ammonium hydroxide, tetrabutylphosphonium hydroxide (TBPH), (2-hydroxyethyl) trimethylammonium hydroxide, (2-hydroxyethyl) triethylammonium hydroxide, (2-hydroxyethyl) tripropylammonium hydroxide, trimethyl-3-hydroxybutyl ammonium hydroxide, trimethyl-4-hydroxybutyl ammonium hydroxide, ethyltrimethylammonium hydroxide, diethyldimethylammonium hydroxide, 3-(trifluoromethyl) phenyltrimethylammonium hydroxide, and combinations thereof. The amount of organic base may be in a range from about 1.0 wt % to about 20 wt %, based on the total weight of the cleaning composition, but preferably from 1 wt % to about 10 wt %.

(B) A chelate agent, which helps prevent re-deposition of removed metal onto the wafer or interposer surface through metal complexation, includes, but not limited to, N,N,N'-trimethyl-N'-(2-hydroxyethyl) ethylenediamine, N,N-dimethylethylenediamine, N,N'-dimethylethanolamine, isobutanolamine, isopropanolamine, 2-(diethylamino) ethanol, aminoethylethanolamine, N-methylaminoethanol, aminoethoxyethanol, dimethylaminoethoxyethanol, diethanolamine, N-methyldiethanolamine, monoethanolamine, triethanolamine, 1-amino-2-propanol, 2-amino-1-butanol, isobutanolamine, triethylenediamine, EDTA, CDTA, HIDA, and N-AEP, 1-methoxy-2-aminoethane, tetraethylenepentamine (TEPA), gluconic acid, tartaric acid, dimethyl glyoxime, formic acid, fumaric acid, glutamic acid, glutamine, glutaric acid, glyceric acid, glycerol, glycolic acid, glyoxylic acid, histidine, iminodiacetic acid, isophthalic acid, itaconic acid, lactic acid, leucine, lysine, maleic acid, maleic anhydride, malic acid, malonic acid, mandelic acid, 2,4-pentanedione, phenylacetic acid, phenylalanine, phthalic acid, proline, propionic acid, pyrocatecol, pyromellitic acid, quinic acid, serine, sorbitol, succinic acid, terephthalic acid, trimellitic acid, trimesic acid, and combinations thereof. The amount of chelating agent(s) may be in a range of 1.0 wt % to 10 wt %, preferably 0.05 wt % to 5 wt % of total weight of disclosed cleaning composition.

(C) An corrosion inhibitor, which protects metal surface from attacking through oxidation and/or galvanic corrosion without compromising interference to atop dielectric deposition from CVD or PECVD, includes, but not limited to, purine compound, such as purine, guanine, hypoxanthine, xanthine, caffeine, uric acid, pyrimidine, aronixil, thonzylamine, buspirone, enazadrem, isoguanine, and methylated or deoxy derivatives thereof; ribosylpurine compound, such as N-ribosylpurine, adenosine, guanosine, 2-aminopurine riboside, 2-methoxyadenosine, and methylated or deoxy derivatives thereof, such as N-methyladenosine, N,N-dimethyladenosine, trimethylated adenosine. The corrosion inhibitors may comprise the combination of the aforementioned inhibitors, derivatives of aforementioned inhibitors, degraded products of aforementioned inhibitors, and oligomers of the aforementioned inhibitors. The inhibitors may be in a range of 0.0 wt % to 5.0 wt % of the total weight of post-CMP cleaning composition.

(D) An antioxidant, which reduces oxidant level in present disclosure composition, includes, but not limited to, gallate compound, such as ethyl gallate, propyl gallate, butyl gallate, octyl gallate, dodecyl gallate, catechin gallate, gallocatechin gallate; epicatechin, quercetin, resveratrol, menthol, hesperitin; and organic acid compounds, such as ascorbic acid, garlic acid. The antioxidants may comprise the combination of the aforementioned antioxidants, derivatives of aforementioned antioxidants, degraded products of aforementioned antioxidants, and oligomers of the aforementioned antioxidants. The antioxidants may be in a range of 0.0 wt % to 2.0 wt % of the total weight of post-CMP cleaning composition.

Preferred cleaning compositions comprise 1.0 wt % to 20 wt % of aqueous tris(2-hydroxyethyl) methylammonium hydroxide; 1.0 wt % to 10 wt % n,n-dimethylethylenediamine; 0.0 wt % to 2.0 wt % corrosion inhibitor from the group consisting guanosine, guanine, n-methyladenosine, xanthine and combinations thereof; 0.0 wt % to 1 wt % antioxidant from the group consisting ethyl gallate, quercetin, resveratrol and combinations thereof; and balance deionized water. Some preferred embodiments contain mixtures of more than one chelating agent and/or corrosion-inhibitor and/or antioxidant.

A present disclosure composition is easily formulated by simple addition of the respective ingredients and mixing to homogeneous condition. Furthermore, the compositions may be readily formulated as single-package formulations or multi-part formulations that are mixed at or before the point of use, e.g., the individual parts of the multi-part formulation may be mixed at the tool or in a storage tank upstream of the tool. The concentrations of the respective ingredients may be widely varied in specific multiples of the composition, i.e., more dilute or more concentrated, and it will be appreciated that the compositions described herein can variously and alternatively comprise, consist or consist essentially of any combination of ingredients consistent with the disclosure herein.

Present disclosure compositions described herein can be further diluted with, for example, deionized water, prior to the post-CMP cleaning process. The cleaning compositions are diluted before use or replenished during or after use wherein up to 500 parts water is added to the composition within about one day prior to the beginning of cleaning process with the resulting mixture. At other times the dilution water can be added to the composition within about one hour prior to the initiation of cleaning process with the resulting mixture. Satisfactory results have been observed with composition dilution factors of from about 1 to about 200.

As applied to semiconductor manufacturing operations, the cleaning compositions described herein are usefully employed to clean post-CMP, post-RIA and post-ashing residues from the surface of the microelectronic substrate containing metal interconnect structures. The cleaning compositions do not damage dielectric or low-k dielectric materials or corrode metal interconnects fabricated on substrates. Moreover, the cleaning compositions are compatible with the barrier liner material, wherein the barrier liners comprise at least one species selected from the group consisting of Ru, Co, W, Mo, Ta, Rh, Mn, TaN, $SiO_2$, alloys thereof, and combinations thereof.

Example

The present disclosure is illustrated in more detail in the following example, which is for illustrative purposes and should not be construed as limiting the scope of the present disclosure.

A preferred cleaning composition comprising 8.0 wt % Tris(2-hydroxyethyl) methylammonium Hydroxide, 4.5 wt % N,N-dimethylethylenediamine, 0.2 wt % guanosine, 0.05 wt % ethyl gallate and balance deionized water was used for the post-CMP cleaning.

A Cu/ULK (SiOCH based ultra low-k film, k=2.4) patterned Si wafer substrate featured with 22 nm gate length and 40 nm line width were used for the post CMP cleaning test. Typically, ULK is a dielectric material of silsesquixoanes, C doped oxides (i.e., organosiliates) with high porosity which has a k-value less than 2.5. The wafers were polished using a CMP wafer polisher with a standard polishing recipe. After polishing, the wafers were cleaned with the present disclosure composition.

The post metal CMP cleaning process includes, as a first step, subjecting a planarized semiconductor wafer containing at least one metal structure (shown in FIG. 3) to a brush clean in present disclosed composition medium. This brush clean may be performed once or multiple times. The brush clean is performed in a roller brush station with mirror-like setting brushing both sides of a wafer. Within the roller brush station and during the brush clean process, the present disclosed composition medium can be continuously or intermediately introduced onto the planarized surface of the semiconductor wafer containing at least one metal structure by one or more spray nozzles. The brush clean can be performed at nominal room temperature from 15° C. to 40° C. Other temperatures can be employed as long as the temperature is not above the boiling point of the acidic medium. The brush clean step of the post metal CMP cleaning process of the present disclosure can be performed in an inert ambient such as, for example, $N_2$, He and/or Ar.

The dipping, as a second step, of the postl CMP cleaning process is performed in a tank that is capable of having one or more CMP processed semiconductor wafers immersed therein. The tank is equipped with a bleed line (for removing a quantity of present disclosure composition from the tank) and a feed line (for introducing a quantity of present disclosure composition into the tank). In some embodiments, the present disclosure composition is continuously being replenished by opening and closing the bleed/feed lines. During dipping process, the CMP processed semiconductor wafer is continuously spun during the dipping step.

Figure 5A:
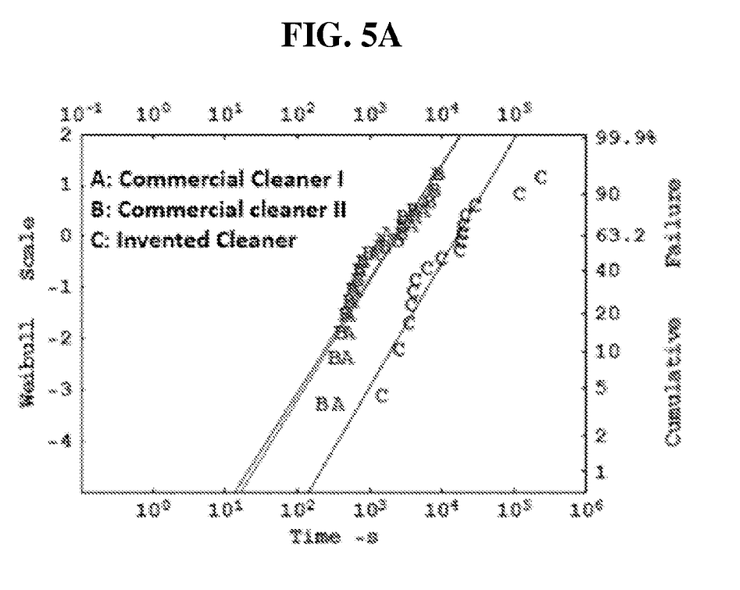
FIG. 5A shows results of breakdown accumulative vs. aging time with 3.63 volt bias at 125° C.
Figure 5B:
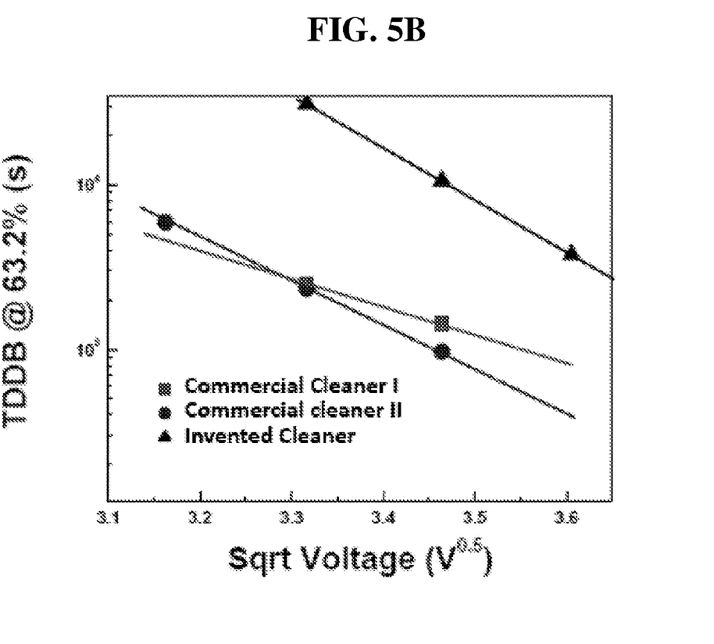
FIG. 5B shows results of time-to-breakdown at 63.2 percentile vs. voltage at 30° C.

Wafers with Cu metallization based on 22 nm design rules were utilized for the experiments. All wafers were polished with an alumina-based Cu slurry and then a silica-based barrier slurry. Two commercial available post-CMP cleaners (commercial cleaner I and commercial cleaner II) and the present invented post-CMP cleaning solution were processed on the polished wafers during first step and second step post-CMP cleanings. TDDB reliability tests are conducted on the cleaned wafers featured 22 nm node Cu interconnect. TDDB test results of breakdown cumulative vs. time with 3.63 volt at 125° C. and time-to-breakdown at 63.2 percentile vs. time at 30° C. are shown in FIG. 5A and FIG. 5B, respectively. Results indicate that TDDB reliabilities from present disclosure composition cleaned wafers outperform that from the commercial available cleaners I & II processed wafers while tested on the same Cu interconnect macro of large W1-chain.

What we claim is:

1. A post Chemical Mechanical Planarization cleaning composition for semiconductor substrates having patterned copper interconnects thereon consisting of:
    Tris(2-hydroxyethyl) methylammonium hydroxide, N,N-dimethylethylenediamine, guanosine, ethyl gallate and a balance of deionized water.

2. A post Chemical Mechanical Planarization cleaning composition according to claim 1 consisting of:
    8.0 wt % of said Tris(2-hydroxyethyl) methylammonium hydroxide, 4.5 wt % of said N,N-dimethylethylenediamine, 0.2 wt % of said guanosine, 0.05 wt % ethyl gallate and said deionized water.

* * * * *